United States Patent [19]
Watanabe et al.

[11] Patent Number: 5,529,888
[45] Date of Patent: Jun. 25, 1996

[54] WATER-SOLUBLE FILM FORMING COMPOSITION

[75] Inventors: Satoshi Watanabe; Toshinobu Ishihara; Yoshihumi Takeda; Katsuyuki Oikawa, all of Nakakubiki-gun, Japan

[73] Assignee: Shin-Etsu Chemical Co., Ltd., Tokyo, Japan

[21] Appl. No.: 531,328

[22] Filed: Sep. 20, 1995

[30] Foreign Application Priority Data

Sep. 21, 1994 [JP] Japan .................. 6-252849

[51] Int. Cl.$^6$ ...................... G03C 5/00
[52] U.S. Cl. .............. 430/331; 430/271.1; 430/273.1; 430/315; 430/324
[58] Field of Search ................ 430/271.1, 273.1, 430/315, 324, 331

[56] References Cited

U.S. PATENT DOCUMENTS

| | | | |
|---|---|---|---|
| H623 | 4/1989 | Miyazako | 456/170 |
| 4,784,936 | 11/1988 | White et al. | 430/271.1 |
| 4,786,581 | 11/1988 | Stahlhofen et al. | 430/331 |

*Primary Examiner*—Hoa Van Le
*Attorney, Agent, or Firm*—Millen, White, Zelano, & Branigan

[57] ABSTRACT

A water-soluble composition comprising a water-soluble N-vinylpyrrolidone copolymer and a fluorinated organic acid in a weight ratio of from 20:80 to 70:30 is useful in forming a water-soluble overlying film on a chemically amplified resist layer. The overlying film functions as both an anti-reflective film and a protective film during resist pattern formation by photolithography.

10 Claims, 2 Drawing Sheets

(a)

(b)

(c)

(d)

WATER-SOLUBLE FILM FORMING COMPOSITION

BACKGROUND OF THE INVENTION

1. Field of the Invention

This invention relates to a water-soluble film forming composition and more particularly, a water-soluble composition for forming a film on a chemically amplified resist layer which lends itself to micro-processing technology in that it has high sensitivity to high energy radiation such as deep ultraviolet lights, electron beams and X-rays and is developable with alkaline aqueous solution to form a pattern.

2. Prior Art

To cope with the increased integration and speed of LSIs, chemically amplified positive working resist compositions using acid catalysts were developed as disclosed in U.S. Pat. No. 4,491,628 and 5,310,619, Japanese Patent Publication (JP-B) No. 27660/1990, and Japanese Patent Application Kokai (JP-A) No. 27829/1988. Because of high sensitivity, resolution and dry etching resistance, they are promising resist materials especially suited for deep ultraviolet lithography.

The deep-UV lithography, however, has the problem that processing of a resist layer to an accurate pattern size is difficult since a resist image is reduced in dimensional accuracy by the influence of standing waves associated with the use of monochromatic light and if a substrate has steps, by the influence of optical interference due to variations in thickness of the resist layer at the steps and the influence of halation at the steps.

Also chemically amplified resists suffer from the problem known as post-exposure delay (PED) that when deep-UV, electron beam or X-ray lithography is carried out, line patterns would have a T-top configuration, that is, patterns become thick at the top if the leave-to-stand or delay time from exposure to post-exposure baking (PEB) is extended. This problem, which arises probably because the resist surface is reduced in solubility, becomes a serious drawback on practical application. This not only makes difficult dimensional control in the lithographic process, but also adversely affects dimensional control in the processing of substrates using dry etching. In this regard, reference is made to W. Hinsberg et al., J. Photopolym. Sci. Technol., 6 (4), 535–546 (1993), T. Kumada et al., J. Photopolym. Sci. Technol., 6 (4), 571–574 (1993), and Hatanaka et al., Preprint of 1994 Spring Meeting of the Applied Physical Society, page 567, 29p, MB-2.

It is understood that the PED problem of chemically amplified resists is dependent on the environment, that is, basic compounds in the air largely participate in the PED problem. In the case of positive resists, light exposure generates acids at the resist surface which react with basic compounds in the air and are thereby deactivated. As the delay time until PEB is extended, more amounts of acids are deactivated and accordingly, decomposition of acid unstable groups are more unlikely to occur. As a consequence, an insolubilized layer is formed at the resist surface, resulting in a T-top configured pattern.

Several patterning techniques were proposed as having solved the above-mentioned problems associated with steps, for example, a multi-layer resist technique as disclosed in JP-A 10775/1976, an ARC technique (anti-reflective coating beneath resist) as disclosed in JP-A 93448/1984, and an ARCOR technique (anti-reflective coating on resist) as disclosed in JP-A 62520/1987, 62521/1987, 188598/1993, 118630/1994, and 148896/1994.

The multi-layer technique involves forming two or three layers of resist and transferring a pattern to form a resist pattern serving as a mask. Undesirably the multi-layer technique requires a number of steps and is low in production efficiency. Light reflection from an intermediate layer can cause a lowering of dimensional accuracy. The ARC technique is by etching an anti-reflective film formed beneath the resist layer. The dimensional accuracy is substantially lost by etching and the extra etching step lowers production efficiency.

In contrast, the ARCOR technique which involves forming a transparent anti-reflective film on a resist layer and peeling the film after exposure is able to form a fine resist pattern to high dimensional and alignment accuracy in a convenient way. By using low index of refraction materials, for example, perfluoroalkyl compounds (e.g., perfluoroalkyl polyethers and perfluoroalkylamines) as the anti-reflective film, the ARCOR technique of JP-A 62520/1987 minimizes reflection light at the resist layer/anti-reflective film interface, thereby reducing the variation of the pattern size of a resist image to one third as compared with a resist layer used alone.

However, since the perfluoroalkyl compounds are less soluble in organic solvents, they must be diluted with such diluents as Freon solvents in order to control the thickness of a coating film. Freon solvents are also used in peeling off anti-reflective films of perfluoroalkyl compounds. The use of Freon is now undesirable from the standpoint of environmental protection. An increased number of steps is another problem.

Using water-soluble polysaccharides as the anti-reflective film material, the technique of JP-A 62521/1987 eliminates intermixing at the resist/anti-reflective film interface and permits removal of the anti-reflective film to be done at the same time as the development step, offering a simple process. However, since the polysaccharides are not so low in refractive index as the perfluoroalkyl compounds, the variation of the pattern size is suppressed to only two thirds as compared with a resist layer used alone.

JP-A 188598/1993 discloses an anti-reflective film forming composition of a two component system comprising a film-forming polymeric binder which is soluble or dispersible in water or aqueous alkaline solution and a low refractive index fluorocarbon compound which is soluble or dispersible in water or aqueous alkaline solution. It is effective as an anti-reflective film material for conventional resists using diazonaphthoquinone compounds. Since all the fluorocarbon compounds used therein have an ammonium ion which can deactivate acid on the chemically amplified resist surface, the above-mentioned PED problem cannot be overcome.

JP-A 118630/1994 discloses an anti-reflective film forming composition comprising at least 90% by weight of a water-soluble film-forming composition and up to 10% by weight of a proton-generating material, based on the solids in the composition. Like JP-A 62521/1987, this composition also lacks the function as an anti-reflective film material for chemically amplified resists because the refractive index is not low. If water-soluble inorganic and organic acids which are exemplified as the proton-generating material are added in amounts of more than 10% by weight based on the solids, the pattern profile is deteriorated by the excess supply of acid. Ammonium weak acid salts which are also exemplified as the proton-generating material can deactivate acid on the chemically amplified resist surface, also failing to overcome the above-mentioned PED problem.

Finally JP-A 148896/1994 discloses an anti-reflective film forming composition comprising a polyvinyl pyrrolidone homopolymer and a fluorinated organic acid ammonium salt. It is used only with conventional resists. Like JP-A 188598/1993, this does not solve the PED problem of chemically amplified resists. Since this composition contains a polyvinyl pyrrolidone homopolymer and is thus free of a hydrophobic unit, a film of this composition can be formed on a resist film with difficulty and has a high refractive index.

SUMMARY OF THE INVENTION

Therefore, an object of the present invention is to provide a water-soluble film-forming composition which can effectively form an overlying film on a chemically amplified resist film, the overlying film having the function of both an anti-reflective film and a protective film and enabling formation of a fine resist pattern at high dimensional accuracy and alignment accuracy in an easy, efficient, reproducible manner.

The inventors have found that when a water-soluble copolymer of N-vinylpyrrolidone with another vinyl monomer (often referred to as an N-vinylpyrrolidone copolymer, hereinafter) is blended with a fluorinated organic acid which is substantially insoluble in water, but well compatible with the N-vinylpyrrolidone copolymer together with water and the resulting aqueous mixture is used as an anti-reflective film material to form an overlying film on a chemically amplified resist layer, this overlying film is an effective anti-reflective and protective film on the chemically amplified resist layer which can reduce reflected light at the resist layer surface without a loss of incident light, substantially suppress the variation of a pattern size due to multiple interference at the resist layer as compared with the use of a resist layer alone, and overcome the PED problem.

More particularly, the fluorinated organic acid is a low refractive index compound substantially insoluble in water. An aqueous mixture of this compound and an N-vinylpyrrolidone copolymer well compatible therewith as major components is used to form an overlying layer on a chemically amplified resist layer. The overlying layer constitutes an anti-reflective layer having a refractive index of up to 1.55 at wavelength 248 nm. This anti-reflective layer is effective for substantially reducing optical reflectance and hence, improving the dimensional accuracy of a resist image, suppressing the variation of a pattern size due to optical multiple interference to one half or less as compared with a resist layer used alone. Formation of a film from the aqueous mixture is easy. No intermixing occurs at the resist layer/anti-reflective film interface. Removal of the anti-reflective film can be done at the same time as the development step, raising no problem from a process aspect. The overall process is simple and evokes no environmental problem. Since no basic materials such as ammonium salts are contained, the PED problem can be solved. Therefore, the overlying film is an effective protective film on the chemically amplified resist layer.

Briefly stated, the present invention provides a water-soluble composition for forming an overlying film on a chemically amplified resist layer, comprising a water-soluble copolymer of N-vinylpyrrolidone with another vinyl monomer and a fluorinated organic acid in a weight ratio of from 20:80 to 70:30.

BEST MODE FOR CARRYING OUT THE INVENTION

Figure 1:
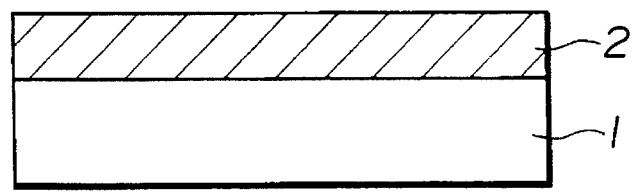
FIG. 1 illustrates a typical lithographic process for positive resist.
Figure 1:
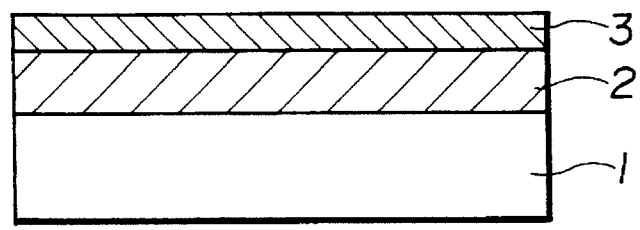
Figure 1:
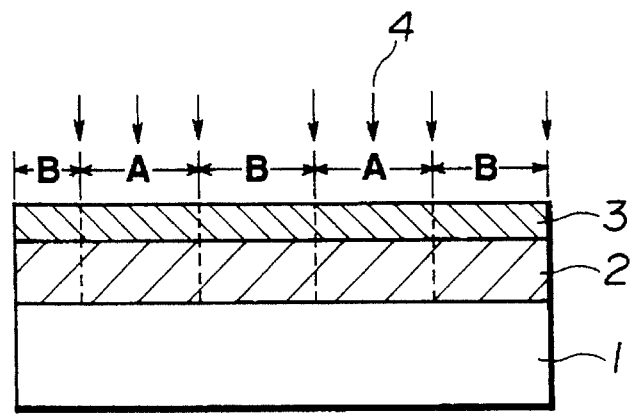
Figure 1:
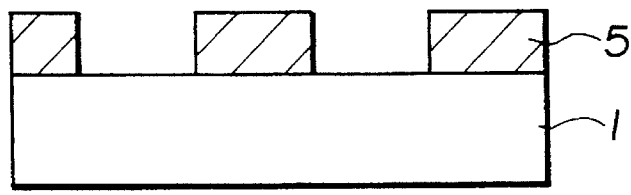

The water-soluble film forming composition of the invention contains an N-vinylpyrrolidone copolymer which is a water-soluble polymer. Examples of the N-vinylpyrrolidone copolymer include N-vinylpyrrolidone/vinyl acetate copolymers, N-vinylpyrrolidone/vinyl alcohol copolymers, N-vinylpyrrolidone/acrylic acid copolymers, N-vinylpyrrolidone/methyl acrylate copolymers, N-vinylpyrrolidone/methacrylic acid copolymers, N-vinylpyrrolidone/methyl methacrylate copolymers, N-vinylpyrrolidone/maleic acid copolymers, N-vinylpyrrolidone/dimethyl maleate copolymers, N-vinylpyrrolidone/maleic anhydride copolymers, N-vinylpyrrolidone/itaconic acid copolymers, N-vinyl-pyrrolidone/methyl itaconate copolymers, and N-vinylpyrrolidone/itaconic anhydride copolymers, with the N-vinylpyrrolidone/vinyl acetate copolymers being preferred. The proportion of N-vinylpyrrolidone and another vinyl monomer polymerizable therewith is not critical although it preferably ranges from 30:70 to 90:10 in a molar ratio. These water-soluble polymers may be used alone or in admixture of two or more.

The water-soluble film forming composition of the invention also contains a fluorinated organic acid which is substantially insoluble in water, but well compatible with the water-soluble polymer or N-vinylpyrrolidone copolymer. The fluorinated organic acid includes acids of the following formulae (1) to (6).

$$F(CF_2)_n COOH \qquad (1)$$

$$H(CF_2)_n COOH \qquad (2)$$

$$F(CF_2CF_2O)_m CF_2 COOH \qquad (3)$$

$$\underset{\underset{CF_3}{|}}{F(CFCF_2O)_m} \underset{\underset{CF_3}{|}}{CFCOOH} \qquad (4)$$

$$F(CF_2)_n SO_3H \qquad (5)$$

$$H(CF_2)_n SO_3H \qquad (6)$$

Figure 2:
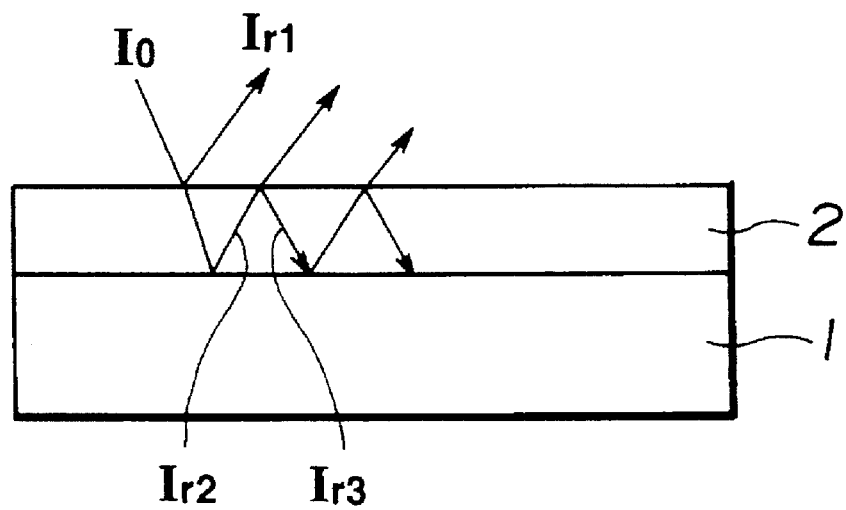
FIG. 2 shows light scattering associated with a resist layer formed on a substrate.
Figure 3:
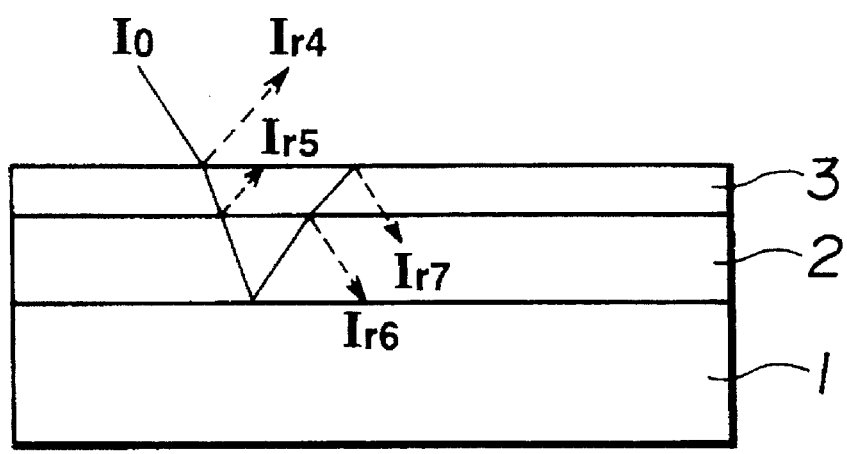
FIG. 3 shows light scattering associated with an anti-reflective film and a resist layer on a substrate.

In the formulae, letter n is an integer of 4 to 15, preferably 6 to 10 and m is an integer of 1 to 10, preferably 2 to 4. The fluorinated organic acid should not form an ammonium salt. +P Typically the water-soluble film forming composition of the invention is an aqueous mixture containing 20 to 70%, preferably 30 to 60% by weight of the N-vinylpyrrolidone copolymer or water-soluble polymer and 30 to 80%, preferably 40 to 70% by weight of the fluorinated organic acid which is substantially insoluble in water, but well compatible with the water-soluble polymer, percent being based on the solids in the aqueous mixture. The aqueous mixture can be spin coated to form a water-soluble film. An N-vinylpyrrolidone copolymer content of less than 20% by weight raises problems with respect to compatibility and film formability whereas a mixture containing more than 70% by weight of the N-vinylpyrrolidone copolymer has a refractive index of more than 1.55 at wavelength 248 nm and becomes less effective for anti-reflection. In the water-soluble film forming composition, the sum of the N-vinylpyrrolidone copolymer and the fluorinated organic acid, that is, the amount of solids is preferably 1 to 30%, especially 2 to 15% by weight of the entire composition in order that the resulting water-soluble layer have a thickness of 300 to 3,000 Å (=0.03 to 0.3 μm). A concentration of less than 1% by weight would lead to formation of a film of less than 300 Å thick which is less effective for anti-reflection and protection purposes whereas a concentration of more than 30% by weight would lead to formation of a film of more than 3,000 Å thick which would undesirably increase the load required in the peeling step. +P The water-soluble film forming composition of the invention may be obtained by mixing the above-mentioned two components together with water and forms a film which not only functions as an anti-reflective film or protective film on chemically amplified resists, but can also be used as an anti-reflective film for conventional resists using diazonaphthoquinone compounds. +P Any desired technique well known for chemically amplified resists may be used in forming a resist pattern using the water-soluble film material according to the present invention. For example, a typical lithographic process for positive resist material is shown in FIG. 1. First a resist layer 2 is formed on a substrate 1 such as a silicon wafer by a suitable technique such as spin coating as shown in FIG. 1(a). The water-soluble film material according to the invention is applied onto the resist layer 2 as by spin coating, forming a water-soluble layer 3 as shown in FIG. 1(b). The water-soluble layer 3 is exposed to a desired pattern of ultraviolet radiation or excimer laser light 4 having a wavelength of 190 to 500 nm by a demagnification projection technique. That is, regions A of the water-soluble layer 3 and photoresist layer 2 are illuminated as shown in FIG. 1(c). After post exposure baking (PEB), the water-soluble layer 3 is removed with water. The photoresist layer 2 is developed with a conventional developer, obtaining a resist pattern 5 as shown in FIG. 1(d). It is noted that removal of the water-soluble layer 3 and development can be done concurrently using an alkaline developer. +P The water-soluble layer 3 preferably has a thickness of 300 to 3,000 Å, especially a thickness of 400 to 440 Å or greater by a factor of 3 or 5 when exposure is made with light of 248 nm. +P Since a positive resist is used as the photoresist layer 2 in the embodiment of FIG. 1, regions B are left as a resist pattern. The chemically amplified resist used herein may be either positive or negative type insofar as it has a contrast threshold value of a desired level relative to light of a given wavelength. +P Referring to FIGS. 2 and 3, it is described how an anti-reflective film made of the water-soluble film forming composition according to the invention reduces optical scattering. FIG. 2 shows a prior art structure in which only a resist layer 2 is formed on a substrate 1. Incident light $I_0$ reaching the resist layer 2 undergoes substantial reflection $I_{r1}$ at the air/resist layer interface with a substantial portion of the incident light quantity being lost. The light entering the resist layer 2 undergoes reflection $I_{r2}$ at the resist layer/substrate interface whereupon the reflected light $I_{r2}$ goes out of the resist layer 2 as emergent light while it is reflected $I_{r3}$ again at the resist layer/air interface. This process is repeated in the resist layer. That is, optical multiple interference occurs in the resist layer 2. +P FIG. 3 shows a structure in which an anti-reflective film 3 according to the invention is formed on a resist layer 2 on a substrate 1. The provision of the anti-reflective film 3 is effective for reducing reflection $I_{r4}$ of incident light $I_0$ at the air/anti-reflective film interface, reflection $I_{r5}$ at the anti-reflective film/resist layer interface, reflection $I_{r6}$ of the reflected light at the resist layer/anti-reflective film interface, and reflection $I_{r7}$ of the reflected light at the anti-reflective film/air interface. Since $I_{r4}$ and $I_{r5}$ are reduced, the loss of incident light quantity is reduced. Since $I_{r6}$ and $I_{r7}$ are reduced, optical multiple interference in the resist layer 2 is suppressed. +P According to the principle of reflection prevention, provided that the resist has an index of refraction n to illuminating light and the illuminating light has a wavelength λ, the reflectivity (amplitude ratio) of an anti-reflective film is reduced as the index of refraction n' of the anti-reflective film approaches to $\sqrt{n}$ and the thickness thereof approaches to an odd multiple of λ/4n. In one example, a phenolic resin material having an index of refraction of about 1.78 is used as the chemically amplified resist material, a water-soluble film according to the invention has an index of refraction of less than 1.50 at 248 nm, and the light used is KrF excimer laser light having a wavelength of 248 nm. Then the optimum thickness of the anti-reflective film is 400 to 440 Å or greater by a factor of 3 or 5. Under these conditions, the use of the anti-reflective film according to the invention is effective for reducing the reflected light and suppressing the optical multiple interference.

EXAMPLE

Examples of the invention are given below by way of illustration and not by way of limitation.

EXAMPLE 1

A positive working chemical amplification type resist material had the following composition.

| Component | pbw |
| --- | --- |
| Polyhydroxystyrene having some hydroxyl groups protected with t-butoxycarbonyl groups | 75 |
| Triphenyl trifluoromethanesulfonate sulfonium | 5 |
| 2,2'-bis(4-tert-butoxycarbonyloxyphenyl)propane | 20 |
| 1-ethoxy-2-propanol | 450–550 |

A water-soluble film forming composition consisted of the following components. A film of this composition had a refractive index of 1.51 at wavelength 248 nm.

| Component | pbw |
| --- | --- |
| Luviskol VA-64 (BASF Japan K.K., copolymer of 6/4 N-vinylpyrrolidone/vinyl acetate) | 2.0 |
| C-5800 (Daikin Fine Chemical Research K.K., 9H-hexadecafluorononanoic acid which is a fluorinated organic acid of general formula (2) wherein n = 8 | 1.3 |
| Ultra-pure water | 96.7 |

A resist pattern was formed according to the lithographic process shown in FIG. 1. First, the positive working chemical amplification type resist material was spin coated on a substrate 1 and pre-baked at 100° C. for 120 seconds to form a resist layer 2 of 0.6 to 1.0 μm thick (see FIG. 1(a)). The water-soluble film forming composition was spin coated on the resist layer 2 to form a water-soluble layer 3 of 410 Å thick (see FIG. 1(b)). Using an excimer laser stepper (Nikon K. K., NSR-2005EX8A, NA=0.5), selected regions are exposed to light (see FIG. 1(c)). The water-soluble layer 3 was removed with ultra-pure water. Post-exposure baking (PEB) was done at 75° C. for 120 seconds and development was done with an aqueous solution of 2.38% tetramethylammonium hydroxide, obtaining a positive pattern (see FIG. 1(d)).

The resulting 0.35-μm line-and-space resist pattern was examined for dimensional variation. The variation was about ±0.050 μm or more with lithography using a resist layer alone. The lithography using a resist layer and a water-soluble layer as mentioned above could reduce the variation to about ±0.020 μm. When the leave-to-stand or delay time from exposure to PEB was 1 hour, the dimensional variation was about ±0.020 μm.

Equivalent results were obtained where removal of the water-soluble layer 3 with ultra-pure water was not effected prior to PEB, but after PEB, and where removal of the water-soluble layer 3 with ultra-pure water was not effected before or after PEB, but concurrently with the development with an aqueous solution of 2.38% tetramethylammonium hydroxide.

EXAMPLE 2

A water-soluble film forming composition consisted of the following components. A film of this composition had a refractive index of 1.45 at wavelength 248 nm.

| Component | pbw |
| --- | --- |
| Luviskol VA-64 (BASF Japan K.K., copolymer of 6/4 N-vinylpyrrolidone/vinyl acetate) | 1.3 |
| C-1800 (Daikin Fine Chemical Research K.K., perfluorononanoic acid which is a fluorinated organic acid of general formula (1) wherein n = 8 | 1.9 |
| Ultra-pure water | 96.8 |

A resist pattern was formed according to the lithographic process shown in FIG. 1. First, the positive working chemical amplification type resist material was spin coated on a substrate 1 and pre-baked at 100° C. for 120 seconds to form a resist layer 2 of 0.6 to 1.0 μm thick (see FIG. 1(a)). The water-soluble film forming composition was spin coated on the resist layer 2 to form a water-soluble layer 3 of 420 Å thick (see FIG. 1(b)). Using an excimer laser stepper (Nikon K. K., NSR-2005EX8A, NA=0.5), selected regions are exposed to light (see FIG. 1(c)). The water-soluble layer 3 was removed with ultra-pure water. Post-exposure baking (PEB) was done at 75° C. for 120 seconds and development was done with an aqueous solution of 2.38% tetramethylammonium hydroxide, obtaining a positive pattern (see FIG. 1(d)).

The resulting 0.35-μm line-and-space resist pattern was examined for dimensional variation. The variation was about ±0.050 μm or more with lithography using a resist layer alone. The lithography using a resist layer and a water-soluble layer as mentioned above could reduce the variation to about ±0.015 μm. When the leave-to-stand or delay time from exposure to PEB was 1 hour, the dimensional variation was about ±0.015 μm.

Equivalent results were obtained where removal of the water-soluble layer 3 with ultra-pure water was not effected prior to PEB, but after PEB, and where removal of the water-soluble layer 3 with ultra-pure water was not effected before or after PEB, but concurrently with the development with an aqueous solution of 2.38% tetramethylammonium hydroxide.

EXAMPLE 3

A water-soluble film forming composition consisted of the following components. A film of this composition had a refractive index of 1.46 at wavelength 248 nm.

| Component | pbw |
| --- | --- |
| Copolymer of 6/4 N-vinylpyrrolidone/vinyl alcohol | 1.6 |
| C-1800 (Daikin Fine Chemical Research K.K., perfluorononanoic acid which is a fluorinated organic acid of general formula (1) wherein n = 8 | 1.6 |
| Ultra-pure water | 96.8 |

The resist pattern was formed by the same procedure as in Example 2 except that the water-soluble film forming composition mentioned above was used, obtaining equivalent results.

EXAMPLE 4

A water-soluble film forming composition consisted of the following components. A film of this composition had a refractive index of 1.49 at wavelength 248 nm.

| Component | pbw |
| --- | --- |
| Copolymer of 7/3 N-vinylpyrrolidone/acrylic acid | 1.6 |
| C-5800 (Daikin Fine Chemical Research K.K., 9H-hexadecafluorononanoic acid which is a fluorinated organic acid of general formula (2) wherein n = 8 | 1.6 |
| Ultra-pure water | 96.8 |

The resist pattern was formed by the same procedure as in Example 1 except that the water-soluble film forming composition mentioned above was used, obtaining equivalent results.

EXAMPLE 5

A water-soluble film forming composition consisted of the following components. A film of this composition had a refractive index of 1.50 at wavelength 248 nm.

| Component | pbw |
| --- | --- |
| Copolymer of 7/3 N-vinylpyrrolidone/methyl acrylate | 1.6 |
| C-5800 (Daikin Fine Chemical Research K.K., 9H-hexadecafluorononanoic acid which is a fluorinated organic acid of general formula (2) wherein n = 8 | 1.6 |
| Ultra-pure water | 96.8 |

The resist pattern was formed by the same procedure as in Example 1 except that the water-soluble film forming composition mentioned above was used, obtaining equivalent results.

There has been described a water-soluble film forming composition which can effectively form an overlying film on a chemically amplified resist film. The overlying film has the function of both an anti-reflective film and a protective film and enables formation of a fine resist pattern at high dimensional accuracy and alignment accuracy in an easy, efficient, reproducible manner. Therefore, in the pattern forming step of photolithography for the manufacture of semiconductor integrated circuits, high precision micro-processing can be done even on a substrate having an irregular surface using the composition of the invention.

Japanese Patent Application No. 252849/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A water-soluble composition for forming a film on a chemically amplified resist layer, comprising a water-soluble copolymer of N-vinylpyrrolidone with another vinyl monomer and a fluorinated organic acid in a weight ratio of from 20:80 to 70:30.

2. The composition of claim 1 wherein said fluorinated organic acid is selected from the group consisting of acids of the following formulae (1) to (6):

$$F(CF_2)_n COOH \quad (1)$$

$$H(CF_2)_n COOH \quad (2)$$

$$F(CF_2CF_2O)_m CF_2 COOH \quad (3)$$

$$F(CFCF_2O)_m CFCOOH \atop {\phantom{F(}CF_3 \phantom{CF_2O)_m} CF_3} \quad (4)$$

$$F(CF_2)_n SO_3 H \quad (5)$$

$$H(CF_2)_n SO_3 H \quad (6)$$

wherein n is an integer of 4 to 15 and m is an integer of 1 to 10.

3. The composition of claim 1, wherein the fluorinated organic acid is substantially insoluble in water.

4. The composition of claim 1, suitable for providing an anti-reflective layer having a refractive index of up to 1.55 at 248 nm.

5. The composition of claim 1, wherein the vinyl monomer is vinyl acetate, vinyl alcohol, acrylic acid, methyl acrylate, methacrylic acid, methyl methacrylate, maleic acid, dimethyl maleate, maleic anhydride, itaconic acid, methyl itaconate or itaconic anhydride.

6. The composition of cliam 1, wherein the vinyl monomer is vinyl acetate.

7. The composition of claim 1, wherein the molar ratio of N-vinylpyrrolidone to vinyl monomer is from 30:70 to 90:10.

8. The composition of claim 2, wherein n is 6–10 and m is 2–4.

9. The composition of claim 1, wherein the weight ratio of the copolymer to the fluorinated organic acid is 30:70 to 60:40.

10. The composition of claim 1, wherein the sum of the copolymer and the fluorinated organic acid constiute 1 to 30% by weight of the composition.

* * * * *